United States Patent
Mayr-Schmoelzer et al.

(10) Patent No.: US 11,486,032 B2
(45) Date of Patent: Nov. 1, 2022

(54) HIGH-TEMPERATURE COMPONENT AND METHOD FOR PRODUCING A HIGH-TEMPERATURE COMPONENT

(71) Applicant: PLANSEE SE, Reutte (AT)

(72) Inventors: Bernhard Mayr-Schmoelzer, Reutte (AT); Ingmar Wesemann, Reutte (AT)

(73) Assignee: Plansee SE, Reutte (AT)

( * ) Notice: Subject to any disclaimer, the term of this patent is extended or adjusted under 35 U.S.C. 154(b) by 0 days.

(21) Appl. No.: 16/680,567

(22) Filed: Nov. 12, 2019

(65) Prior Publication Data
US 2020/0095669 A1 Mar. 26, 2020

Related U.S. Application Data

(63) Continuation of application No. PCT/AT2018/000024, filed on Apr. 19, 2018.

(30) Foreign Application Priority Data

May 12, 2017 (AT) .............................. GM 107/2017

(51) Int. Cl.
| | |
|---|---|
| C23C 14/16 | (2006.01) |
| C23C 14/22 | (2006.01) |
| C23C 14/06 | (2006.01) |
| C23C 14/58 | (2006.01) |
| C23C 24/08 | (2006.01) |
| H01J 35/10 | (2006.01) |

(52) U.S. Cl.
CPC .......... *C23C 14/0641* (2013.01); *C23C 14/16* (2013.01); *C23C 14/22* (2013.01); *C23C 14/5806* (2013.01); *C23C 24/087* (2013.01); *H01J 35/105* (2013.01)

(58) Field of Classification Search
CPC ..... C23C 14/0641; C23C 14/16; C23C 14/22; C23C 14/5806; C23C 14/14; C23C 14/34; C23C 14/06; C23C 14/08; C23C 24/087; H01J 35/105; H01J 9/04; H01J 1/42; H01J 61/0735; H01J 61/526; H01K 1/10; H05B 3/12
See application file for complete search history.

(56) References Cited

U.S. PATENT DOCUMENTS

| | | |
|---|---|---|
| 2,895,849 A | 7/1959 | Perlman et al. |
| 3,248,591 A | 4/1966 | Arndt |
| 5,141,776 A | 8/1992 | Merzhanov et al. |
| 5,148,080 A | 9/1992 | Van Thyne |
| 5,742,126 A | 4/1998 | Fujii et al. |
| 6,025,579 A | 2/2000 | Tanaka et al. |

(Continued)

FOREIGN PATENT DOCUMENTS

| | | |
|---|---|---|
| CN | 1119786 A | 4/1996 |
| CN | 201817573 U | 5/2011 |
| CN | 104611618 A | 5/2015 |
| CN | 105695919 A | 6/2016 |

(Continued)

*Primary Examiner* — Daniel J. Schleis
*Assistant Examiner* — Kevin Ct Li
(74) *Attorney, Agent, or Firm* — Laurence A. Greenberg; Werner H. Stemer; Ralph E. Locher

(57) ABSTRACT

A high-temperature component of a refractory metal or a refractory metal alloy has an emissivity-increasing coating. The coating is formed of tantalum nitride and/or zirconium nitride; and tungsten with a tungsten content between 0 and 98 wt. %.

16 Claims, 5 Drawing Sheets

(56) References Cited

U.S. PATENT DOCUMENTS

| | | | |
|---|---|---|---|
| 6,486,602 B1 * | 11/2002 | Setzer | H01J 61/0735 313/40 |
| 2001/0033950 A1 * | 10/2001 | Billings | B22C 3/00 428/698 |
| 2003/0141494 A1 | 7/2003 | Govyadinov et al. | |
| 2003/0224220 A1 | 12/2003 | Nguyen et al. | |
| 2004/0051984 A1 | 3/2004 | Oshino et al. | |
| 2010/0046717 A1 | 2/2010 | Zhong et al. | |
| 2010/0261034 A1 * | 10/2010 | Cardarelli | C23C 28/021 428/615 |
| 2014/0041589 A1 * | 2/2014 | Martinz | B22F 5/006 118/724 |
| 2014/0115972 A1 * | 5/2014 | Webb | B22F 7/06 51/307 |
| 2014/0226792 A1 | 8/2014 | Hansen et al. | |

FOREIGN PATENT DOCUMENTS

| | | |
|---|---|---|
| DE | 1182743 | 12/1964 |
| DE | 1696630 | 11/1971 |
| DE | 60001741 T2 | 11/2003 |
| DE | 202009013860 U1 | 12/2010 |
| EP | 0791950 A2 | 8/1997 |
| EP | 1019948 A1 | 7/2000 |
| GB | 1173876 | 12/1969 |
| GB | 2124023 A | 2/1984 |
| JP | S5451465 A | 4/1979 |
| JP | 2004029314 A | 1/2004 |
| JP | 2013521134 A | 6/2013 |
| JP | 2014216133 A | 11/2014 |
| JP | 2015527742 A | 9/2015 |
| WO | 0008672 A1 | 2/2000 |
| WO | 2008017156 A1 | 2/2008 |

* cited by examiner

N₂

Ar

HV

N₂

Ar

HV

HIGH-TEMPERATURE COMPONENT AND METHOD FOR PRODUCING A HIGH-TEMPERATURE COMPONENT

CROSS-REFERENCE TO RELATED APPLICATION

This application is a continuation, under 35 U.S.C. § 120, of copending international application PCT/AT2018/000024, filed Apr. 19, 2018, which designated the United States; this application also claims the priority, under 35 U.S.C. § 119, of Austrian application GM 107/2017, filed May 12, 2017; the prior applications are herewith incorporated by reference in their entirety.

BACKGROUND OF THE INVENTION

Field of the Invention

The invention relates to a high-temperature component of a refractory metal, and to a method for producing a high-temperature component.

In many high-temperature applications, heat transfer predominantly takes place by heat radiation. A determining factor for the heat radiation emitted at a given temperature is the degree of emission, or the emissivity, of the surfaces involved in the heat transfer. The emissivity indicates how much radiation a body gives off relative to an ideal black body.

The higher the emissivity of a surface, the more thermal radiation output a body can give off via said surface.

The same applies analogously for the absorption of thermal radiation output: since emissivity and absorptivity of a body are proportional, a body with high emissivity also absorbs more radiation output than a body with low emissivity.

In the case of technical surfaces via which heat transfer by means of radiation is to take place, it is therefore endeavored to select the emissivity thereof to be as high as possible. A high emissivity allows the same radiation output to be given off at lower component temperatures.

This is immediately apparent from the Stefan-Boltzmann law, which, in a modification for gray bodies, indicates the thermally radiated output of a gray body in dependence on the temperature thereof:

$$P = \varepsilon(T) \cdot \sigma \cdot T^4$$

where P is the radiated output, $\varepsilon(T)$ is the weighted average emissivity over all wavelengths, a is the Stefan-Boltzmann constant and T is the temperature in Kelvin.

Lower component temperatures are generally favorable with respect to a lifetime of the component.

In the prior art there are various proposals for increasing the emissivity of high-temperature components:

United States published patent application US 2014/0041589 A1 describes a heating conductor that at least partially has a porous sintered coating of tungsten. A slurry method is used to apply the coating. The porous sintered coating brings about an increase in emissivity in comparison with a smooth tungsten surface.

There are examples of increasing the emissivity for high-temperature components in other applications as well:

European published patent application EP 1019948 (A1) describes a coating of a dendritic metal or a metallic compound for an anode of a high-pressure discharge lamp, whereby emissivity values (expressed in terms of the emission coefficient) of above 0.8 are to be obtained. Rhenium is mentioned as particularly suitable for this, since a dendritic structure can be created particularly well therewith.

A similar approach is taken by European published patent application EP 0791950 (A2), according to which fine-grained tungsten is sintered on around a tip of a high-pressure discharge lamp.

German patent DE 1182743 B discloses that the emission coefficient of an anode for a high-pressure discharge lamp is increased by cooling grooves and, in one embodiment, additionally by sintered-on tantalum carbide.

According to those documents, the emissivity is increased in comparison with an uncoated anode of tungsten substantially by increasing the surface area.

SUMMARY OF THE INVENTION

It is an object of the present invention to provide an improved high-temperature component and a method for producing the same.

With the above and other objects in view there is provided, in accordance with the invention, a high-temperature component, comprising:

a component body of refractory metal or a refractory metal alloy; and an emissivity-increasing coating on said component body, said coating consisting essentially of: at least one nitride selected from the group consisting of tantalum nitride and zirconium nitride, and optional tungsten with a tungsten content between 0 and 98 wt. %.

The applications considered in connection with this application are applications with operating temperatures of typically 1000-2500° C. or more. These include in particular applications in lighting technology (e.g., electrodes in high-pressure discharge lamps), furnace technology (e.g., heating conductors, internal furnace fittings, charging equipment, crucibles) and medical technology (e.g., rotating X-ray anodes).

The components with such high operating temperatures are referred to in the context of this application as "high-temperature components."

Refractory metals or refractory metal alloys are generally used for the high-temperature applications mentioned. In connection with the present application, refractory metals are understood to mean the metals of the fourth group (titanium, zirconium and hafnium), of the fifth group (vanadium, niobium, tantalum) and of the sixth group (chromium, molybdenum, tungsten) of the periodic table and rhenium. What is meant by refractory metal alloys are alloys having at least 50 at. % of the element concerned. Among the properties of these materials are that they have outstanding dimensional stability at high working temperatures.

Bare metals generally have a very low emissivity. The emissivity of tungsten at room temperature, for example, is approximately 0.2 in the wavelength range 1700-2500 nm.

A high-temperature component of the generic type has an emissivity-increasing coating. In this case, the coating may be applied to the entire component or only to parts thereof.

According to the invention, the emissivity-increasing coating is essentially formed from zirconium nitride and/or tantalum nitride and tungsten to a content of 0 to 98 wt. %.

The expression "consisting essentially of," as used in this context (i.e., in the claims), means that the main constituents are zirconium nitride and/or tantalum nitride and optionally tungsten. The scope of the claim is limited to the recited materials and other materials that do not materially affect the basic and novel characteristics of the claimed invention. The layer may contain small amounts of other constituents and customary impurities. Incorporated impurities may be, for example, oxides or carbides, and metallic tantalum and/or zirconium.

The applicant has observed that the nitrides take up oxygen at high temperatures. The coating therefore may also contain oxides of zirconium and/or tantalum.

The proportion of the main constituents zirconium nitride and/or tantalum nitride, and possibly their oxides, and optionally tungsten, may preferably be over 98 wt. %.

The zirconium nitride is generally of the chemical empirical formula ZrN and the tantalum nitride is generally of the chemical empirical formula TaN, but they could also be other nitrides or sub- or superstoichiometric compounds containing nitrogen. For the sake of simplicity, however, in the application mention is made of ZrN or TaN, respectively.

The coating may either be formed exclusively (optionally excluding the constituents and impurities given above) from ZrN and/or TaN. Alternatively, the layer may contain up to 98 wt. % tungsten.

According to a first embodiment, the coating is formed as a PVD (physical vapor deposition) layer.

In this case, the coating is created on the substrate (a surface of the high-temperature component) by a suitable sputter target in a physical vapor deposition process. A PVD layer is generally smooth and dense and therefore has no pores. To increase the surface area, before the coating the substrate may be structured by a mechanical, chemical or thermal method.

Alternatively, the coating is formed as a sintered layer. A sintered layer is understood to mean a layer that is obtained by a powder-metallurgical coating method. A slurry coating may be mentioned as an example of a powder-metallurgical coating method. After the actual application of the coating substance in the form of particles, the layered application is consolidated by sintering. A sintered layer is generally porous and has a rough surface.

The coating is preferably formed as a composite layer of finely distributed zirconium nitride particles and/or tantalum nitride particles and tungsten particles. A composite layer is understood to mean a layer that is composed of a mixture and in which the basic constituents exhibit their original solid-state properties. This feature can be realized in particular whenever the coating is formed as a sintered layer.

PVD and sintered layers can be easily distinguished on account of the very different surface finishes.

By virtue of the production, a sintered layer preferably has a thickness between 2 μm and 300 μm, more preferably between 3 μm and 100 μm, particularly preferably between 5 μm and 50 μm.

In the case of PVD layers, the thickness may also be significantly smaller. Typical thicknesses of PVD layers are between 10 nm and 4 μm.

The thickness of the coating is not decisive for its function.

The coating is preferably formed on the outer side of the high-temperature component. This means that the coating forms the outermost layer on the surface of the high-temperature component. In one use of the high-temperature component, this layer is intended to take part in heat transfer by means of radiation.

Further layers may be present therebelow.

The coating is particularly preferably formed from ZrN and tungsten with a content of ZrN in percent by weight between 2 wt. % and 75 wt. % ZrN, preferably between 3 wt. % and 60 wt. % ZrN, particularly preferably between 5 wt. % and 45 wt. % ZrN.

It has been shown in tests conducted by the applicant that a coating of a mixture of ZrN and tungsten has particularly favorable emissivity values. It has surprisingly been found that a coating of a mixture of ZrN and tungsten has a higher emission coefficient that that of pure ZrN and that of pure tungsten.

The emissivity maximum was reached at approximately 36 wt. % ZrN. Here, an emission coefficient $\varepsilon$ of around 0.8 could be achieved at room temperature. The emission coefficient $\varepsilon$ of pure ZrN is approximately 0.5, the emission coefficient of bare tungsten is approximately 0.2. It could not therefore have been expected in any way that the emission coefficient of a mixture of ZrN and tungsten has a higher value than the pure forms of the species.

In addition, this enables a particularly economic preparation of the coating, since the emissivity-promoting substance—ZrN here—can be conserved.

Furthermore, the presence of tungsten in the coating brings about good compatibility with the refractory metal forming the substrate for the coating.

ZrN is moreover significantly less expensive than TaN. Therefore, the coating based on ZrN represents a particularly advantageous variant in economic terms.

An emissivity-increasing layer based on nitrides is particularly favorable for applications in which an oxygen getter effect is desired. The applicant has observed that the nitrides take up oxygen at high temperatures. This allows the high-temperature component to be protected from oxidation.

The coating is preferably formed to be porous. The term "porous," in this context, means that the coating has a substantial pore content of, say, over 5%. The pores that are present in the volume of the coating also increase the surface area of the coating in comparison with the purely geometric surface, whereby the emissivity is further increased. This feature is applicable in particular for sintered layers.

In one variant, the surface of the high-temperature component beneath the coating is structured, such that the surface area of the coating is increased in comparison with the purely geometric surface. The emissivity is further increased thereby. That is to say, the coating itself is not necessarily porous here. The surface area is increased by the structuring of the substance (of the high-temperature component). This is relevant in particular whenever the coating is formed as a PVD layer.

In a preferred embodiment, the high-temperature component is an electrode of a high-pressure discharge lamp. The use of the coating on an electrode, in particular the anode of a high-pressure discharge lamp, is particularly advantageous. Coating an electrode, in particular the anode, with an emissivity-increasing coating allows it to give off a higher thermal radiation output, whereby the lifetime is increased. In other words, the electrode formed in such a way can give off more heat during operation, which leads to a reduced component temperature.

According to one exemplary embodiment, the high-temperature component is formed as a heating conductor. In the context of this application, what is meant by heating conductors are metallic resistance heaters as used in heat-treatment installations. Heating conductors may be formed from sheet metal, bar material, twisted wire, bundled wire or from wire mesh. In the case of planar heating conductors, that is to say heating conductors the basic form of which derives from a sheet metal, it may be desired to provide the coating solely on that side of the heating conductor that faces a furnace interior during operation of the heating conductor.

When used on a heating conductor, the coating allows said heating conductor to produce a given heating output at a lower temperature. A lower operating temperature of the heating conductor is favorable, since this can for example reduce creep. Of particular interest is the coating with an emissivity-increasing coating of heating conductors used in coating installations, in particular MOCVD (metal-organic chemical vapor deposition) installations. Here, an excessive temperature of the heating conductor may lead to a vaporization of the base material of the heating conductor (for instance tungsten) and as a result to a contamination of the substrate to be coated. With a higher emissivity, the heating conductor can be operated with the same heating output at a lower temperature, whereby the risk of contamination of the substrate to be coated is reduced. In particular, it is beneficial here that the vapor pressure of ZrN and TaN is comparable to that of tungsten. That is to say, a coating based on ZrN and/or TaN allows the heating conductor equipped in this way to be operated at a lower temperature, without the effect of the reduced temperature of the heating conductor being compensated for by a higher vapor pressure of the coating. Overall, a lower operating temperature extends the lifetime of a high-temperature component.

According to another exemplary embodiment, the high-temperature component is formed as a crucible. Crucibles of refractory metal are used for example to melt aluminum oxide in the production of single-crystal sapphires. For this purpose, the crucibles are placed in a high-temperature furnace and warmed there by radiant heat from heating conductors. The heat transfer predominantly takes place via the lateral surfaces of the crucible, which absorb the radiant heat and transmit it to the product to be melted. The coating according to the invention couples a greater proportion of the heat given off by heating conductors into the crucible.

The high-temperature component preferably consists of at least 98 wt. % tungsten. Tungsten has proven to be particularly suitable for the relevant high-temperature components.

With the above and other objects in view there is also provided, in accordance with the invention, a method for producing a high-temperature component with an emissivity-increasing coating, the method comprising:

providing a main component body of the high-temperature component and carrying out one of the following method steps i), ii), or iii):

i) increasing a surface area of the main body of the high-temperature component, and coating the main component body with ZrN and/or TaN and optionally tungsten by physical vapor deposition;

or ii) coating the main component body with Zr-containing and/or Ta-containing powder, and optionally tungsten, by a powder-metallurgical method, and heat treating the coated main body in a nitrogen-containing atmosphere;

or iii) coating the main component body with ZrN and/or TaN, and optionally tungsten, by a powder-metallurgical method, and heat treating the coated main body in a nitrogen-containing and/or argon-containing atmosphere.

The term "main body" or "main component body" is understood to mean the high-temperature component or the semifinished product from which the component is produced, before coating.

Three different method variants are thus proposed.

According to the first method variant i), first a surface of the main body of the high-temperature component is pre-treated such that the surface area is increased in comparison with the geometric surface. This "roughening" may be effected for example by a slurry coating.

In the case of a slurry method, powdered constituents are suspended in a liquid. Components (here the main body of a high-temperature component) may be coated with the suspension obtained, which generally also contains binders, by dipping, spraying or by brush or the like. After drying, the coating is generally sintered. The coating formed in this way is generally porous and rough. It forms a favorable underlying surface for a subsequent coating with tungsten and ZrN and/or TaN by physical vapor deposition (PVD). The slurry coating may for example be based on tungsten powder.

As an alternative or in addition, the surface may be structured by a mechanical, chemical or thermal method. Blasting, for instance sandblasting, may be mentioned as an example of a mechanical method. Etching or pickling represents an example of a chemical method. Laser structuring may be mentioned as an example of a thermal method.

Then, ZrN and/or TaN and optionally tungsten are deposited on the main body of increased surface area. As a source for the coating, a sputter target with a corresponding composition may be used. The preferred layer composition can be set by suitable selection of the target composition. In the case of coatings with ZrN, a PVD coating composition of ZrN and tungsten with between 2 wt. % and 75 wt. % ZrN, preferably between 3 wt. % and 60 wt. % ZrN, particularly preferably between 5 wt. % and 45 wt. % ZrN is particularly advantageous.

For TaN, a mixture with tungsten brings about a reduction in emissivity in comparison with pure TaN, while for ZrN the emissivity of mixtures with tungsten is surprisingly higher than that of the respective pure species.

Increasing the surface area brings about an additional increase in emissivity over and beyond that caused by the coating substance.

This method variant (PVD route) may be advantageous if for example a recrystallization of the base material is to be avoided in order to obtain certain mechanical properties. In addition, the distortion of components with narrow component tolerances can be avoided by this method variant. The PVD coating specifically takes place at moderate temperatures and does not require a step of heat treating the coating.

According to the second method variant ii), first the main body is coated with Zr-containing and/or Ta-containing powder and optionally tungsten by a powder-metallurgical method and then subjected to a heat treatment in a nitrogen-containing atmosphere.

The powder-metallurgical method may be a slurry method. Here, Zr-containing and/or Ta-containing means that the powder of the powder-metallurgical method contains zirconium and/or tantalum. It may for example be metallic zirconium and/or metallic tantalum. In particular for zirconium, a hydride form has however also been successfully used. Mixtures of the Zr-containing and/or Ta-containing powder with tungsten are favorable. This applies in particular for zirconium.

The powder-metallurgically applied layer is preferably sintered or presintered.

First, a layer that contains zirconium and/or tantalum in elemental form or in a compound is obtained. In the subsequent step of heat treating the coated main body in a nitrogen-containing atmosphere, the Zr-containing and/or Ta-containing species is transformed into the respective nitride. Adjustment of the nitrides to increase the emissivity thus takes place in situ according to this method variant.

The nitrogen-containing atmosphere may be a gas mixture with nitrogen ($N_2$). Ammonia ($NH_3$) is also suitable as a nitrogen source.

By adjusting the ratio of Zr-containing and/or Ta-containing powder to tungsten, the desired layer composition can be set. As already stated, a composition of ZrN and tungsten with between 2 wt. % and 75 wt. % ZrN, preferably between 3 wt. % and 60 wt. % ZrN, more preferably between 5 wt. % and 45 wt. % ZrN is of particular interest.

This method variant may be advantageous if, for example, nitriding heat treatment installations are available in any case.

This variant may offer an advantage in terms of costs in comparison with the method variant i) or iii) by virtue of an availability of installations and primarily by virtue of the availability of Zr-containing and Ta-containing powders.

On the other hand, this method also makes it possible to provide areas with a nitride-containing layer that cannot be coated by a conventional PVD method (shading effects in the PVD coating).

According to the third method variant iii), the main body is coated with ZrN and/or TaN and optionally tungsten by a powder-metallurgical method and a subsequent heat treatment of the coated main body in a nitrogen-containing and/or argon-containing atmosphere. The powder-metallurgical method may again be a slurry method.

The coating may be effected either with ZrN or TaN alone, mixtures thereof or with mixtures of ZrN and/or TaN and tungsten.

Mixtures of ZrN and tungsten have proven to be of particular interest, in particular a mixture of ZrN and tungsten with between 2 wt. % and 75 wt. % ZrN, preferably between 3 wt. % and 60 wt. % ZrN, particularly preferably between 5 wt. % and 45 wt. % ZrN.

In this method variant, the respective nitrides are thus incorporated directly in the powder-metallurgical coating step. The heat treatment predominantly serves here for the mechanical consolidation of the layer. The atmosphere therefore does not necessarily have to be a nitriding atmosphere.

The heat treatment in a nitrogen- or argon-containing atmosphere preferably takes place at temperatures above 1400° C. The nitrogen- or argon-containing atmosphere may for instance be a gas mixture with nitrogen ($N_2$).

This method variant is advantageous by virtue of the simple production. Depending on the availability of installations and raw materials this variant may be more cost-effective than the above-presented method variants. In addition, this variant makes it possible to control the build-up of the layer. The nitrides are processed directly and can thus be distributed in a graded or uniform manner over the entire layer thickness.

Individual method variants are explained in more detail in the following production examples.

Production Example I

To produce an improved high-temperature component, tungsten samples were coated with slurries of various powder mixtures.

For this purpose, first tungsten powder and/or ZrN powder and/or TaN powder were weighed out into a binder of 2.8 wt. % ethyl cellulose in ethanol to a total solids content of 55±2 wt. %. Stirring took place at 1500 rpm for 15 minutes with a Multimaster apparatus from Netzsch. The solution was then dispersed for 1.5 minutes in a HD 2200 ultrasonic homogenizer from Bandelin.

The following layer compositions were investigated:
100 wt. % TaN
80 wt. % TaN, remainder tungsten
66 wt. % TaN, remainder tungsten
50 wt. % TaN, remainder tungsten
33 wt. % TaN, remainder tungsten
100 wt. % tungsten
6 wt. % ZrN, remainder tungsten
9 wt. % ZrN, remainder tungsten
13 wt. % ZrN, remainder tungsten
23 wt. % ZrN, remainder tungsten
36 wt. % ZrN, remainder tungsten
50 wt. % ZrN, remainder tungsten
76 wt. % ZrN, remainder tungsten
100 wt. % ZrN The percentages by weight mentioned here refer to the original sample weight of the solid constituents ZrN, TaN and/or tungsten.

The original sample weight of 36 wt. % ZrN corresponds to a molar ratio of zirconium to tungsten of approximately 1:1.

Spray coating then took place manually on tungsten platelets at a distance of approx. 20 cm so as to give a target layer mass of 15 mg/cm2. Drying took place in ambient air.

The dried-on layer was then subjected to a heat treatment (annealing). In said heat treatment, first the organic phase (binder) is removed and then the layer is consolidated and/or sintered.

The heat treatment took place at 1900° C. for one hour in each case. In order to study the influence of the sintering atmospheres, said sintering atmospheres were varied: sintering was performed under argon (Ar), nitrogen ($N_2$) and a high vacuum.

The emissivity of the layers was measured at room temperature with a 410-Solar reflectometer from Surface Optics Corporation. In so doing, the layers according to the invention were compared with an uncoated tungsten surface and with emissivity-increasing coatings known from the prior art.

A plurality of wavelength ranges were investigated. To compare the emissivities, the measurement results in the range between 1700-2500 nm were used, since this range is of particular relevance for the assessment of the thermal radiation of a body.

A selection of results is summarized in Table 1:

TABLE 1

Emissivity comparison for various coatings

| | Sample | Emissivity ε | Observation |
|---|---|---|---|
| 1 | Tungsten (bare) | 0.21 | Prior art |
| 2 | Tungsten - porous | 0.34 | Prior art |
| 3 | TaN (100 wt. %) | 0.90 | according to the invention (exemplary embodiment) |
| 4 | Tungsten + 36 wt. % ZrN | 0.78 | according to the invention (exemplary embodiment) |

An uncoated bare tungsten surface, sample no. 1, exhibited an average emissivity of 0.21 in the investigated wavelength range between 1700-2500 nm.

A porous tungsten coating (sample no. 2) obtained from a 100% tungsten slurry had an emissivity of 0.34.

In the case of sample no. 3, TaN (100 wt. %), an emissivity of 0.90 was measured. In this case, the coating consisted purely of TaN, i.e. without addition of tungsten. In the production of this sample, TaN was applied by a slurry method and then subjected to a heat treatment at 1900° C. for 1 h under $N_2$.

Sample no. 4 had a coating of 36 wt. % ZrN, remainder tungsten. The powder mixture of ZrN and W was applied to the sample by a slurry method and sintered at 1900° C. for 1 h under $N_2$. The emissivity was determined to be 0.78.

Production Example II

An alternative form of the emissivity-increasing coating is obtained by producing a sintered layer with Zr and/or Ta and subsequent nitriding. In the production example, a Ta slurry layer was applied and this was then nitrided in an $NH_3$ atmosphere. At least some of the tantalum is transformed into a tantalum nitride by the nitriding treatment. An increase in emissivity in comparison with a porous Ta layer was established on samples produced in this way.

In an analogous manner, a ZrN layer can be realized by a nitriding treatment of a previously applied W—Zr coating.

Production Example III

Another variant of a form of the emissivity-increasing coating is obtained by applying the coating of ZrN and/or TaN by PVD. In the production example, first the substrate was provided with a conventional slurry layer for increasing the surface area.

In this example, pure TaN was deposited thereupon by PVD. An emission coefficient ε of 0.9 could be achieved at room temperature with this coating of 100 wt. % TaN.

Although the invention is illustrated and described herein as being embodied in a high temperature component and a method of producing a high-temperature component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1A:
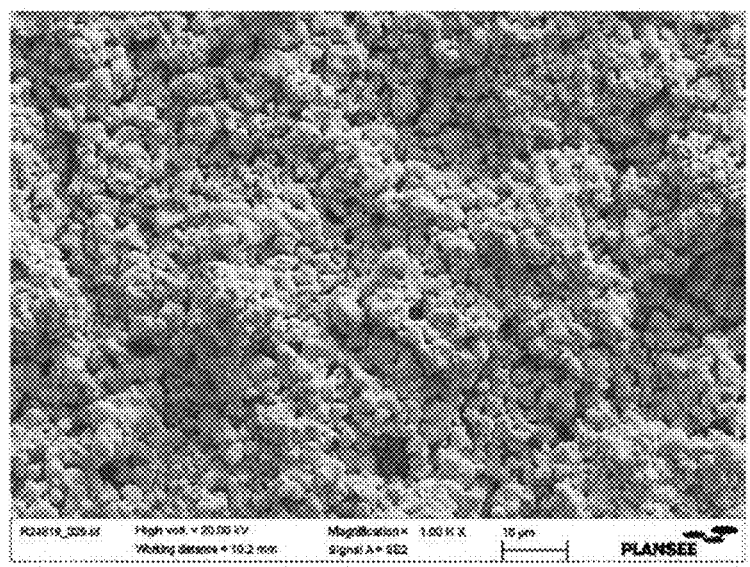
FIG. 1A, FIG. 1B, and FIG. 1C show scanning electron micrographs of TaN-coated surfaces after various annealing treatments.

Referring now to the figures of the drawing in detail and first, particularly, to FIG. 1A thereof, there is shown a scanning electron micrograph of a TaN-coated surface that was annealed at 1900° C. for one hour in a nitrogen atmosphere. The coating was realized by a slurry coating with TaN powder.

The viewing direction is normal to the coated surface.

By contrast with annealing under argon (FIG. 1B) and a high vacuum (FIG. 1C), the layer in a nitrogen atmosphere remained stable and exhibited no indentation or smoothing.

Under argon and in particular under a high vacuum, indentation and smoothing by oxidation and sintering were observed.

For a high emissivity, a porous surface finish, such as the TaN surface in FIG. 1a, is sought.

Determination of the emissivity ε on the TaN layer after the various annealing treatments revealed in particular for the vacuum annealing a great decrease in the emissivity to 0.77 in comparison with 0.90 for the sample annealed under nitrogen.

Figure 1B:
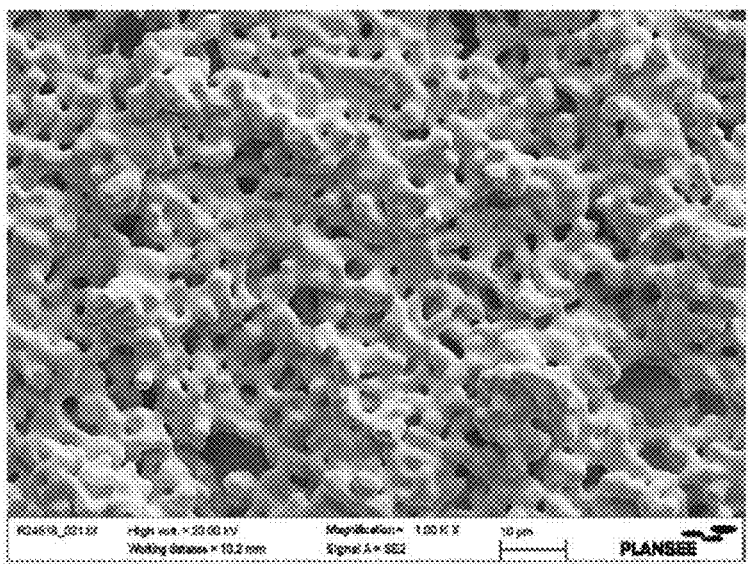
Figure 1C:
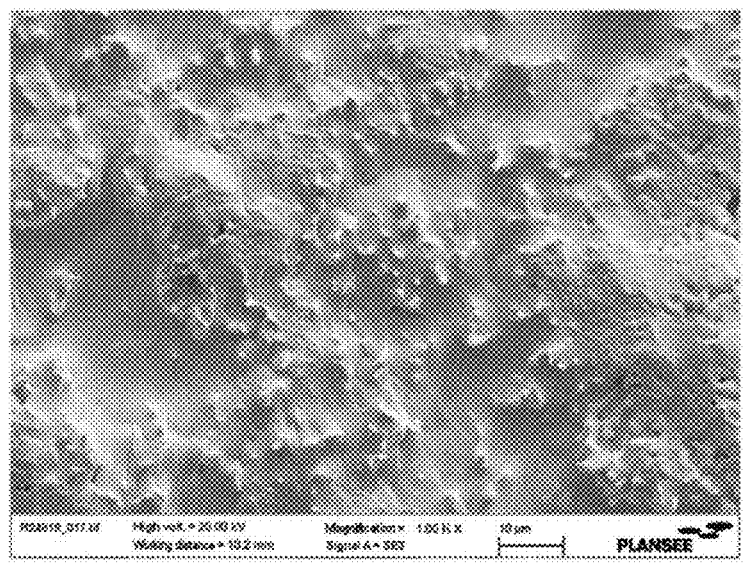
Figure 2A:
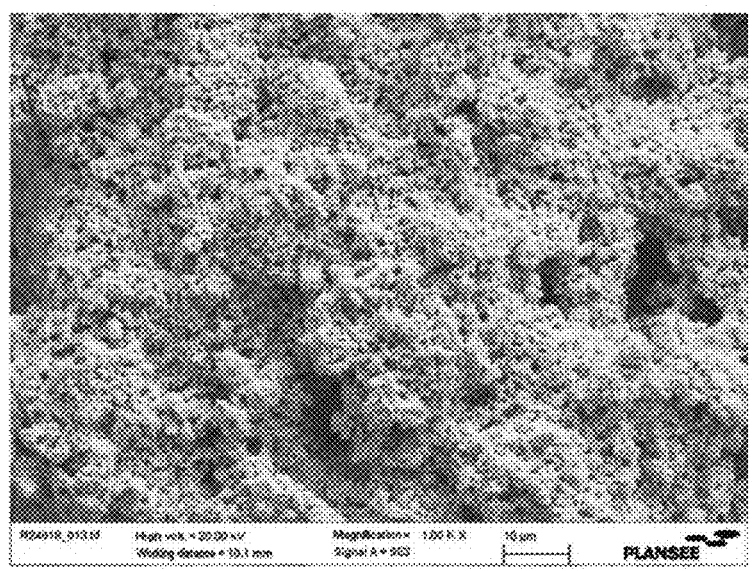
FIG. 2A, FIG. 2B, and FIG. 2C show scanning electron micrographs of surfaces coated with 36 wt. % ZrN, remainder tungsten, after various annealing treatments.
Figure 2B:
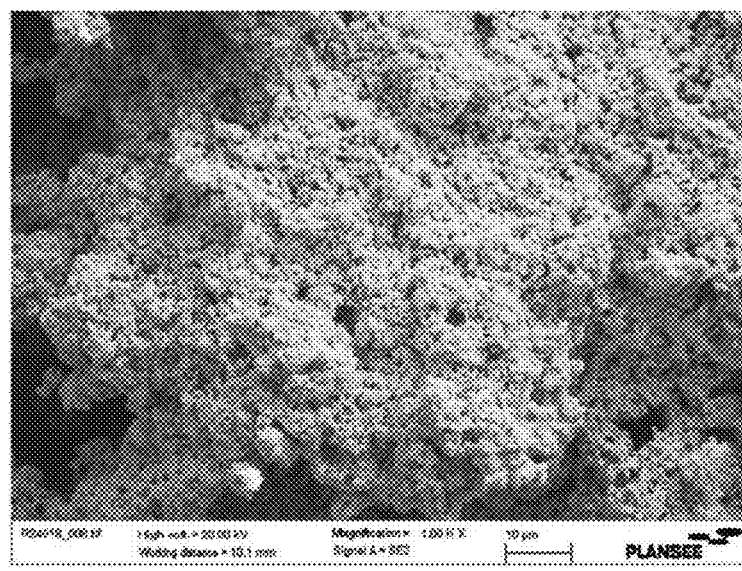
Figure 2C:
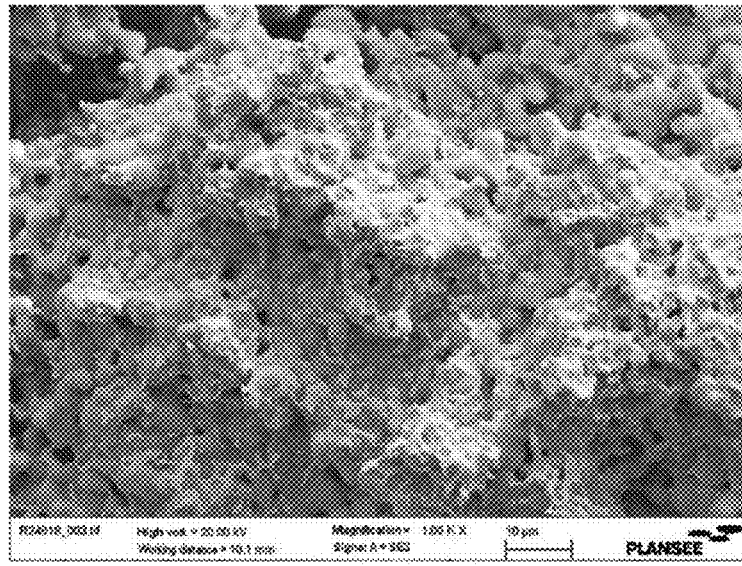

FIGS. 2A to 2C show, analogously to FIGS. 1A to 1C, scanning electron micrographs of coated surfaces with 36 wt. % ZrN, remainder tungsten, after different annealing treatments.

The coating was realized by a slurry coating with ZrN powder and tungsten powder.

The sample in FIG. 2A was annealed under N2, the sample of FIG. 2B under Ar, the sample of FIG. 2C under a high vacuum.

The sample of 36 wt. % ZrN, remainder tungsten, exhibited significant indentation and oxidation after annealing under a high vacuum. For a high emissivity, a porous surface finish, such as in FIG. 2A, is sought.

Figure 3A:
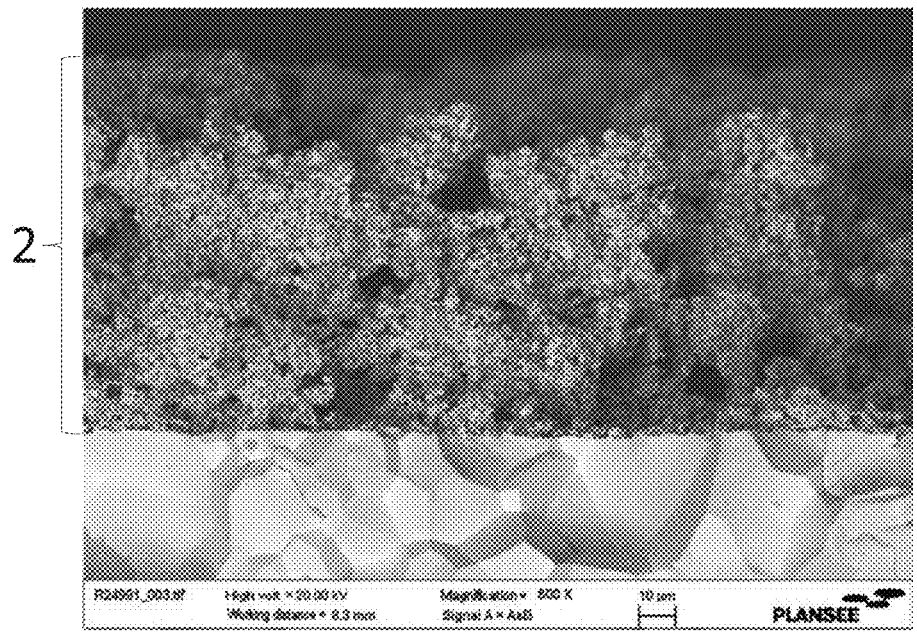
FIG. 3A and FIG. 3B show scanning electron micrographs of fracture surfaces.

FIG. 3A shows a scanning electron micrograph of a fracture surface normal to the surface of a sample with a coating of 36 wt. % ZrN, remainder tungsten. The coating was realized by a slurry coating with ZrN powder and tungsten powder.

The substrate of tungsten sheet-metal material can be seen in the bottom part of the image. The emissivity-increasing coating 2 can be seen thereabove. The porosity of the coating 2 can readily be seen. The porosity contributes further to an increase in emissivity.

Figure 3B:
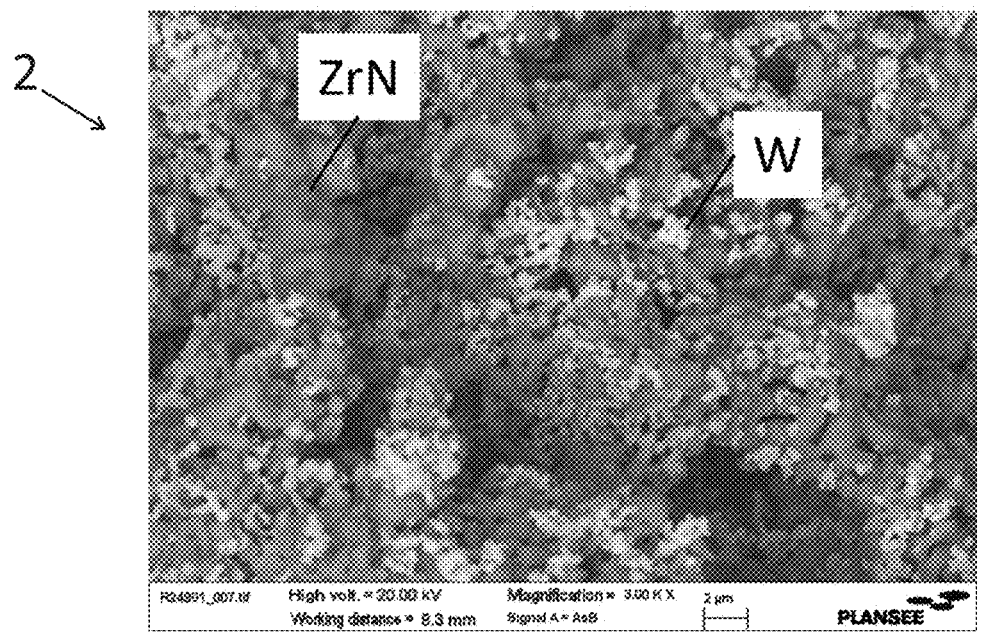

FIG. 3B shows a detail of a fracture surface of the same sample at a higher magnification. The tungsten particles ("W") in a ZrN matrix can be seen therein. It is thus a composite layer of zirconium nitride particles and tungsten particles.

The volume fraction (measured by quantitative structural analysis) of the particularly advantageous variant is approx. 80% ZrN and 20% W.

Figure 4:
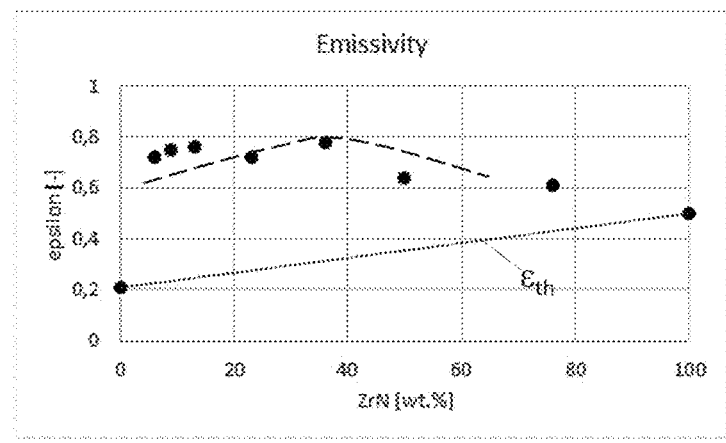
FIG. 4 shows a diagram of the emissivity epsilon (E) for various coatings.

FIG. 4 shows a diagram of the emissivity epsilon (ε) for various coatings 2 based on ZrN with varying ZrN contents.

The ZrN content in wt. % is plotted on the horizontal axis (x axis), the resulting emissivity epsilon (ε) is plotted on the vertical axis (y axis). The points in the diagram denote the respective measurement values. The measurement value for 0% ZrN corresponds to the emissivity of a bare tungsten surface (ε=0.21), the measurement value for 100% ZrN corresponds to the emissivity of a pure ZrN coating without tungsten (ε=0.50). A schematic trend line is depicted by dashed lines.

It can be seen that the emissivities of a coating of a mixture of ZrN and tungsten unexpectedly do not extend along a straight line between the values for pure tungsten and pure ZrN, as indicated by the dotted line "$\varepsilon_{th}$". Rather, a coating of a mixture of ZrN and tungsten exhibits a maximum value in the range of around 36 wt. % ZrN. The emissivity in this case is not very sensitive with respect to even lower contents of ZrN, i.e. even at contents of down to 5 wt. % for instance, attractively high values for the emissivity could still be obtained. At contents of over 40 wt. % ZrN, by contrast, the emissivity greatly decreases. As can be seen from the diagram, a composition of ZrN and tungsten with between 2 wt. % and 75 wt. % ZrN, preferably between 3 wt. % and 60 wt. % ZrN, more preferably between 5 wt. % and 45 wt. % ZrN is of particular interest.

Figure 5:
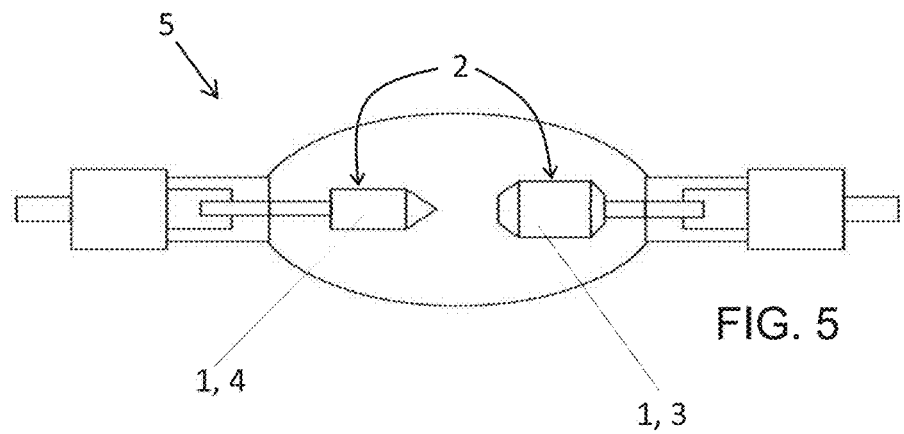
FIG. 5 schematically shows a high-pressure discharge lamp as an exemplary embodiment of a high-temperature component.

FIG. 5 schematically shows a high-pressure discharge lamp 5. A discharge arc is formed between the electrodes—a cathode 4 and an anode 3—during operation. In the present exemplary embodiment, the anode 3 is the high-temperature component 1 and is provided with an emissivity-increasing coating 2 according to the invention.

The coating 2 allows the anode 3 to give off a higher thermal radiation output, whereby the lifetime is increased.

Likewise, the cathode 4 or both the anode 3 and the cathode 4 can be provided with the coating 2.

Shown here in an exemplary manner on a high-pressure discharge lamp 5, the emissivity-increasing coating 2 can also be used for other lamp types.

Figure 6:
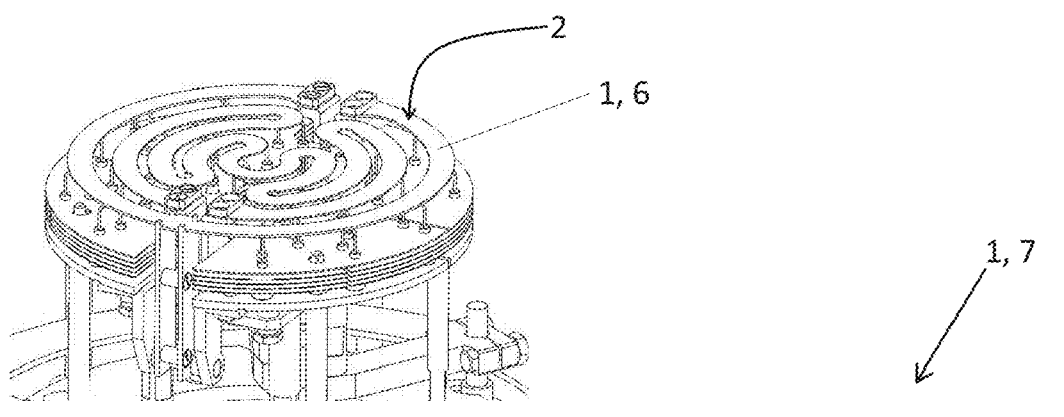
FIG. 6 shows a heating conductor as an exemplary embodiment of a high-temperature component.

FIG. 6 shows a heating conductor 6 of a refractory metal in an exemplary arrangement as a base heater of a high-temperature furnace. The heating conductor 7 is heated by passing a current directly through it and warms the interior of the high-temperature furnace by giving off radiant heat.

In the present exemplary embodiment, the heating conductor 6 is the high-temperature component 1 and is provided with an emissivity-increasing coating 2 according to the invention. When used on a heating conductor 6, the coating 2 allows said heating conductor 6 to produce a given heating output at a lower temperature. This reduces creep of the heating conductor 6 and extends the lifetime.

Figure 7:
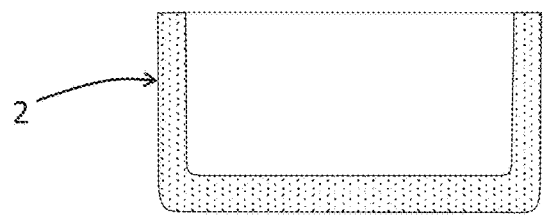
FIG. 7 shows a crucible as an exemplary embodiment of a high-temperature component.

FIG. 7 schematically shows a crucible 7 of refractory metal. Crucibles of refractory metal are used for example to melt aluminum oxide in the production of single-crystal sapphires. For this purpose, the crucibles are placed in a high-temperature furnace and warmed there by radiant heat from heating conductors. The heat transfer predominantly takes place via the lateral surface of the crucible, which absorbs the radiant heat and transmits it to the product to be melted. In the present exemplary embodiment, the crucible 7 is the high-temperature component 1 and is provided with an emissivity-increasing coating 2 according to the invention.

When used on a crucible 7, the coating 2 brings about the effect that a greater proportion of the heat given off by heating conductors is coupled into the crucible 7. The crucible 7 thereby reacts more quickly to a heat input from heating conductors.

The use of the coating 2 is in no way limited to the examples shown here. The coating 2 is generally advantageous for high-temperature components, at which heat transfer by means of radiation is to take place.

Figure 8A:
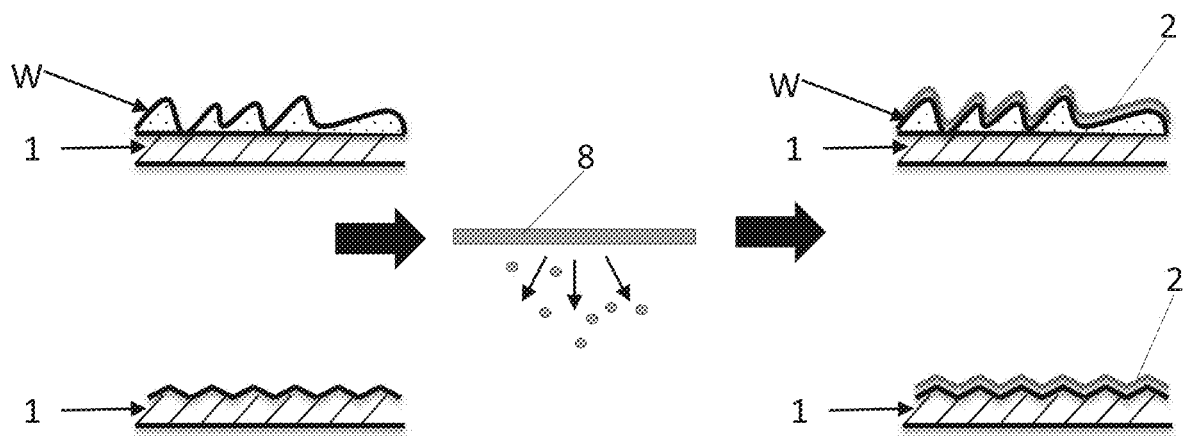
FIG. 8A, FIG. 8B, and FIG. 8C are schematic views of exemplary implementations of the method according to the invention.
Figure 8B:
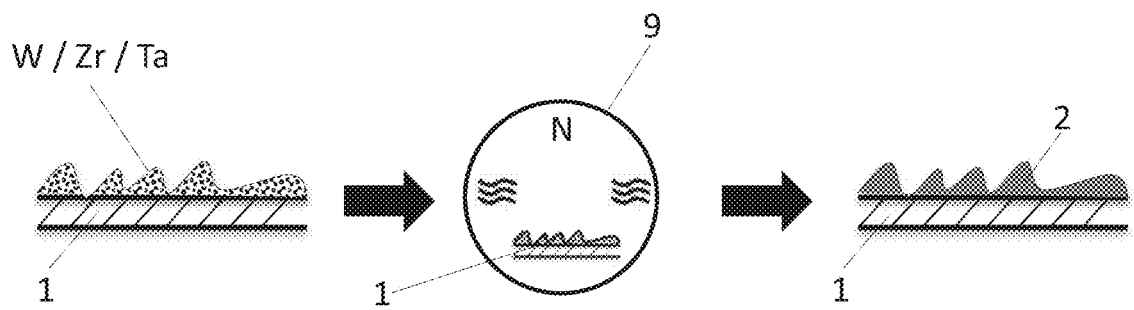
Figure 8C:
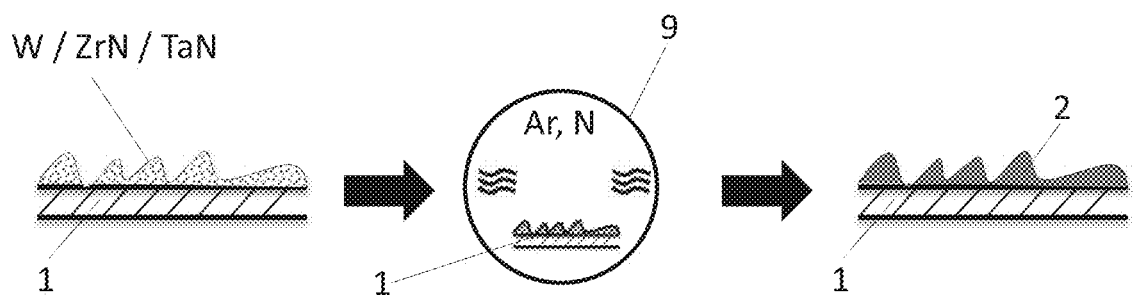

FIGS. 8A to 8C schematically show the procedure of exemplary embodiments of the method according to the invention.

FIG. 8A shows the procedure of method variant i).

The left half of the figure shows the main body of the high-temperature component 1, the surface area of which has been increased by undergoing a treatment. The measure of increasing the surface area serves for increasing the emissivity.

According to the top image, the surface area way increased by applying a slurry layer. In the example, tungsten powder ("W") was used to apply the slurry layer. Instead of a tungsten slurry, other slurry compositions compatible with the substrate may also be used. After the slurry coating, the application of powder is sintered (not specifically illustrated).

According to the bottom image, the surface area was increased by a mechanical, chemical or thermal structuring.

In both cases of the exemplary embodiment, the substrate, that is to say the main body of the high-temperature component 1, is of tungsten.

The main body of the high-temperature component 1 is then coated with tungsten and ZrN and/or TaN by physical vapor deposition. The sputter process is schematically indicated in the center of the image by a sputter target 8. Either the target 8 may consist of the components of the layer, or alternatively the nitride may also be formed during the process.

The result, the high-temperature component 1 with an emissivity-increasing coating 2, is illustrated in the right half of the image. The composition of the PVD layer may be determined by the selection of the sputter target composition. The PVD layer generally has a thickness of only several nm or a few μm.

FIG. 8B shows the procedure of method variant ii).

The left half of the image illustrates that a powder-metallurgical method imparts a coating with a Zr-containing and/or Ta-containing powder and optionally tungsten to the main body of the high-temperature component 1. An example of a powder-metallurgical coating method is a slurry method.

In the middle image, the subsequent heat treatment of the coated main body of the high-temperature component 1 in a nitrogen-containing atmosphere is illustrated. In the heat treatment device 9 indicated, the letter "N" symbolizes the nitrogen-containing atmosphere. The heat treatment transforms zirconium and/or tantalum into the corresponding nitrides and consolidates the coating.

As illustrated in the right half of the image, a high-temperature component 1 with the emissivity-increasing coating 2 is obtained.

FIG. 8C shows the procedure of method variant iii).

The main body of the high-temperature component 1 comprising a layer with ZrN and/or TaN and optionally tungsten applied by a powder-metallurgical method is illustrated on the left.

The middle image illustrates the subsequent heat treatment of the coated main body of the high-temperature component 1 in a nitrogen-containing and/or argon-containing atmosphere. In the heat treatment device 9 indicated, the letter "N" symbolizes the nitrogen-containing atmosphere, "Ar" symbolizes the argon-containing atmosphere. The coating is consolidated by the heat treatment.

As illustrated in the right half of the image, a high-temperature component 1 with the emissivity-increasing coating 2 is obtained.

The following is a list of reference numerals and the corresponding structures used in the above description and in the drawing:

1 High-temperature component
2 Emissivity-increasing coating
3 Anode
4 Cathode

5 High-pressure discharge lamp
6 Heating conductor
7 Crucible
8 Sputter target
9 Heat treatment device

The invention claimed is:

1. A high-temperature component, comprising:
a component body of refractory metal or a refractory metal alloy;
an emissivity-increasing coating on said component body, said coating consisting essentially of: at least one nitride selected from the group consisting of tantalum nitride and zirconium nitride, and tungsten with a tungsten content of more than 0 wt. % and up to 98 wt. %; and
wherein said coating is a sintered composite layer of tantalum nitride particles and/or zirconium nitride particles, and tungsten particles.

2. The high-temperature component according to claim 1, wherein said coating is formed as a sintered layer.

3. A high-temperature component, comprising:
a component body of refractory metal or a refractory metal alloy;
an emissivity-increasing coating on said component body, said coating consisting essentially of zirconium nitride and tungsten with a tungsten content of between 25 wt % and 98 wt. %, and a zirconium nitride content of between 2 wt. % and 75 wt. %;
wherein said coating is a sintered composite layer of zirconium nitride particles and tungsten particles.

4. The high-temperature component according to claim 1, wherein said coating is formed of zirconium nitride and tungsten, with a zirconium nitride content of between 2 wt. % and 75 wt. %.

5. The high-temperature component according to claim 1, wherein said coating is a porous coating.

6. The high-temperature component according to claim 1, wherein said coating is formed on an outer side of said component body.

7. The high-temperature component according to claim 1, wherein the high-temperature component is an electrode of a high-pressure discharge lamp.

8. The high-temperature component according to claim 1, wherein the high-temperature component is a heating conductor.

9. The high-temperature component according to claim 1, wherein the high-temperature component is a crucible.

10. A method for producing the high-temperature component according to claim 1, the method comprising: providing the component body of the high-temperature component; coating the component body with the at least one nitride selected from the group consisting of tantalum nitride and zirconium nitride, and also with the tungsten, by a powder-metallurgical method, and heat treating the coated component body in a nitrogen-containing and/or argon-containing atmosphere.

11. The method according to claim 10, wherein the step of coating the component body of the high-temperature component comprises subjecting the component body to mechanical, chemical, or thermal structuring.

12. The method according to claim 10, wherein the step of coating the component body comprises coating by a slurry process.

13. The method according to claim 10, wherein the heat treatment is carried out at temperatures above 1400° C.

14. The high-temperature component according to claim 3, wherein said coating is a composite layer of zirconium nitride particles and tungsten particles.

15. The high-temperature component according to claim 3, comprising a zirconium nitride content of between 5 wt. % and 45 wt. % ZrN.

16. The high-temperature component according to claim 1, comprising a zirconium nitride content of between 5 wt. % and 45 wt. % ZrN.

* * * * *